United States Patent
Miyamoto et al.

(10) Patent No.: US 10,288,694 B2
(45) Date of Patent: May 14, 2019

(54) SECONDARY BATTERY MONITORING DEVICE AND METHOD FOR DIAGNOSING FAILURE

(71) Applicant: SII Semiconductor Corporation, Chiba-shi, Chiba (JP)

(72) Inventors: Yasuhiro Miyamoto, Chiba (JP); Nao Otsuka, Chiba (JP); Atsushi Igarashi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/842,268

(22) Filed: Dec. 14, 2017

(65) Prior Publication Data

US 2018/0172771 A1   Jun. 21, 2018

(30) Foreign Application Priority Data

Dec. 15, 2016  (JP) .................................. 2016-243667
Nov. 9, 2017   (JP) .................................. 2017-216008

(51) Int. Cl.
  *G01R 19/165*  (2006.01)
  *G01R 31/382*  (2019.01)
  *G01R 31/388*  (2019.01)
  *G01R 31/396*  (2019.01)

(52) U.S. Cl.
  CPC ......... *G01R 31/382* (2019.01); *G01R 31/388* (2019.01); *G01R 31/396* (2019.01); *G01R 19/16542* (2013.01)

(58) Field of Classification Search
  CPC .. G01R 31/382; G01R 31/396; G01R 31/388; G01R 19/16542
  USPC ............................................. 324/764.01, 429
  See application file for complete search history.

(56) References Cited

U.S. PATENT DOCUMENTS

| 2008/0164881 A1* | 7/2008 | Miyamoto ............. G01R 15/04 324/429 |
| 2009/0179650 A1 | 7/2009 | Omagari |
| 2014/0055896 A1 | 2/2014 | Muramoto et al. |

FOREIGN PATENT DOCUMENTS

JP    2004-127663 A    4/2004

OTHER PUBLICATIONS

European Patent Office, European Search Report in European Application No. 17207553 dated Apr. 16, 2018, pp. 1-5.

* cited by examiner

*Primary Examiner* — Farhana A Hoque
(74) *Attorney, Agent, or Firm* — Brinks Gilson & Lione

(57) ABSTRACT

A secondary battery monitoring device is equipped with a resistance circuit and a detection circuit detecting an abnormality of a secondary battery, a current generation circuit generating a failure detection circuit for setting an output terminal of the resistance circuit to a failure diagnosis voltage, and a switch which permits the failure detection circuit to flow to the output terminal of the resistance circuit by switching. Further, a method for diagnosing failure of the secondary battery monitoring device is provided.

6 Claims, 2 Drawing Sheets

SECONDARY BATTERY MONITORING DEVICE AND METHOD FOR DIAGNOSING FAILURE

RELATED APPLICATIONS

This application claims priority under 35 U.S.C. § 119 to Japanese Patent Application Nos. 2016-243667 filed Dec. 15, 2016 and 2017-216008 filed Nov. 9, 2017, the entire content of which are hereby incorporated by reference.

BACKGROUND OF THE INVENTION

Field of the Invention

The present invention relates to a secondary battery monitoring device and a method for diagnosing failure.

Background Art

A conventional secondary battery monitoring device which detects abnormalities of secondary batteries connected in series is equipped with a function of detecting a failure of itself.

A secondary battery monitoring device is equipped with abnormality detection circuits provided for each secondary battery, and a circuit for changing determination voltage which changes an abnormality determination voltage of each abnormality detection circuit. Further, the secondary battery monitoring device changes the abnormality determination voltage of the abnormality detection circuit by means of the circuit for changing determination voltage to detect the voltage of the secondary battery, thereby detecting a failure of the abnormality detection circuit (refer to, for example, Japanese Patent Application Laid-Open No. 2004-127663).

However, in the case of a failure that the value of a reference voltage from a reference voltage circuit shifts, it is difficult for the conventional secondary battery monitoring device to detect a failure that a determination voltage increases upon overcharge detection, and a failure that a determination voltage decreases upon overdischarge detection. Further, even at a resistance ratio of voltage division resistors, it is difficult to detect an abnormality depending on the way of occurrence of the abnormality. That is, the conventional secondary battery monitoring device is accompanied by difficulties in the detection of a failure depending on a failure location and a failure mode.

SUMMARY OF THE INVENTION

The present invention has been made to provide a secondary battery monitoring device and a method for diagnosing failure both capable of detecting a failure irrespective of a failure location and a failure mode.

There is provided a secondary battery monitoring device according to one aspect of the present invention, comprising, a resistance circuit to which both ends of the secondary battery are connected and which outputs a detection voltage from an output terminal, a detection circuit which detects an abnormality of the secondary battery, based on the detection voltage, a voltage-to-current conversion circuit to which both ends of the secondary battery are connected and which converts a voltage of the secondary battery to a current, a current-to-voltage conversion circuit which converts the current of the voltage-to-current conversion circuit to a voltage, a first current generation circuit which generates a first current proportional to the voltage of the secondary battery, based on the voltage of the current-to-voltage conversion circuit, a second current generation circuit which generates a second current proportional to a voltage for setting the output terminal of the resistance circuit to a failure diagnosis voltage, a current mirror circuit which generates a failure detection circuit corresponding to the first current and the second current, and a switch which permits the failure detection circuit to flow to the output terminal of the resistance circuit.

Further, there is provided a method for diagnosing failure according to another aspect of the present invention, which is suitable for a secondary battery monitoring device detecting an abnormality of each of secondary batteries, including a first resistance circuit to which both ends of a first secondary battery are connected and which outputs a first detection voltage from an output terminal, a first detection circuit which detects an abnormality of the first secondary battery, based on the first detection voltage, a first voltage-to-current conversion circuit to which both ends of the first secondary battery are connected and which converts a voltage of the first secondary battery to a current, a second resistance circuit to which both ends of a second secondary battery connected in series with the first secondary battery are connected and which outputs a second detection voltage from an output terminal, a second detection circuit which detects an abnormality of the second secondary battery, based on the second detection voltage, a second voltage-to-current conversion circuit to which both ends of the second secondary battery are connected and which converts a voltage of the second secondary battery to a current, a current-to-voltage conversion circuit which has an input terminal connected to the first voltage-to-current conversion circuit through a first switch and connected to the second voltage-to-current conversion circuit through a second switch and which converts the current of the first or second voltage-to-current conversion circuit to a voltage, a first current generation circuit which generates a first current proportional to the voltage of the first secondary battery, based on the voltage of the current-to-voltage conversion circuit, a second current generation circuit which generates a second current proportional to a voltage for setting the output terminal of the first or second resistance circuit to a failure diagnosis voltage, a current mirror circuit which generates a failure detection circuit corresponding to the first current and the second current, a third switch which permits the failure detection circuit to flow to the output terminal of the first resistance circuit, and a fourth switch which permits the failure detection circuit to flow to the output terminal of the second resistance circuit, and the method includes the steps of applying a voltage from an external power supply to a terminal to which both ends of the second secondary battery are connected, turning off the first switch, turning on the second switch, turning on the third switch, and turning off the fourth switch, and thereby diagnosing a failure of the secondary battery monitoring device according to a result of detection by the first detection circuit.

According to a secondary battery monitoring device and a method for diagnosing failure of the present invention, it is possible to detect a failure irrespective of a failure location and a failure mode.

DETAILED DESCRIPTION OF THE INVENTION

Figure 1:
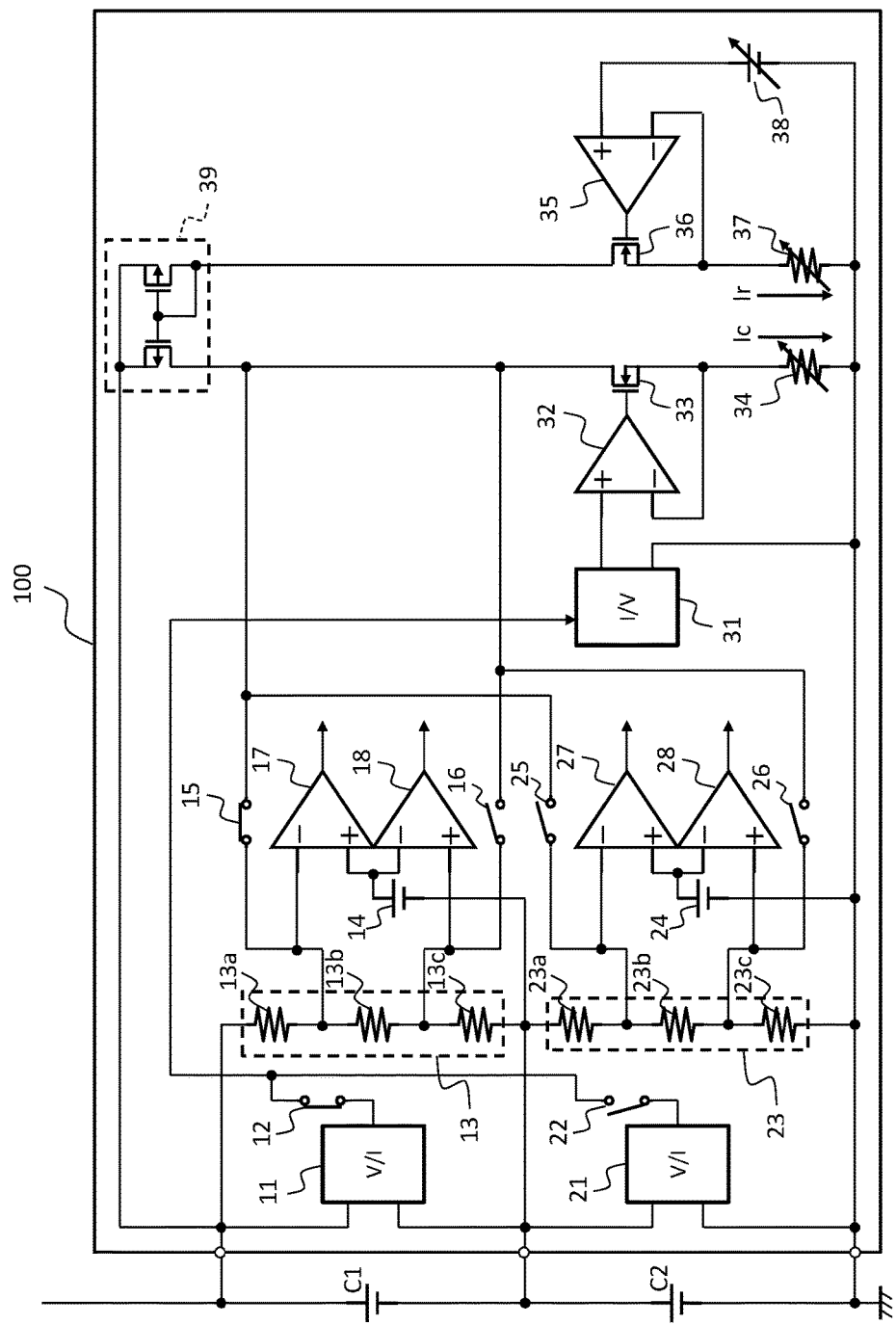
FIG. 1 is a block diagram illustrating a secondary battery monitoring device of the present invention.

FIG. 1 is a block diagram illustrating a secondary battery monitoring device 100 according to an embodiment of the present invention.

The secondary battery monitoring device 100 is equipped with voltage-to-current conversion circuits 11 and 21, selection switches 12 and 22, resistance circuits 13 and 23, reference voltage circuits 14 and 24, switches 15, 16, 25, and 26, comparators 17, 18, 27, and 28, a current-to-voltage conversion circuit 31, operational amplifiers 32 and 35, MOS transistors 33 and 36, resistors 34 and 37, a reference voltage circuit 38, and a current mirror circuit 39.

Also, although not illustrated in the drawing, the secondary battery monitoring device 100 is equipped with a control circuit which controls a charge/discharge control switch by voltage information or the like of secondary batteries C1 and C2, and so on.

The comparators 17 and 27 detect overdischarge. The comparators 18 and 28 detect overcharge. The resistance circuit 13 has three resistors 13a, 13b, and 13c connected in series whose resistance values are assumed to be Ra, Rb, and Rc respectively. The resistance circuit 23 has three resistors 23a, 23b, and 23c connected in series whose resistance values are assumed to be Ra, Rb, and Rc respectively. The reference voltage circuits 14 and 24 respectively output a reference voltage vref.

The voltage-to-current conversion circuits 11 and 21, the current-to-voltage conversion circuit 31, the operational amplifier 32, the MOS transistor 33, and the resistor 34 are a current generation circuit which generates a current Ic for equalizing the potential of a node in the resistance circuit 13 (23) detected by the comparator 17 or 18 (27 or 28) to a reference potential of the reference voltage circuit 14 (24). The operational amplifier 35, the MOS transistor 36, the resistor 37, and the reference voltage circuit 38 are a current generation circuit which generates a current Ir for allowing the node in the resistance circuit 13 (23) detected by the comparator 17 or 18 (27 or 28) to have a voltage for failure diagnosis.

The voltage-to-current conversion circuit 11 has input terminals connected across the secondary battery C1, and an output terminal connected to an input terminal of the current-to-voltage conversion circuit 31 through the selection switch 12. The resistance circuit 13 has both ends connected across the secondary battery C1, a first output terminal connected to an inverting input terminal of the comparator 17, and a second output terminal connected to a non-inverting input terminal of the comparator 18. The reference voltage circuit 14 has an output terminal connected to a non-inverting input terminal of the comparator 17 and an inverting input terminal of the comparator 18.

The voltage-to-current conversion circuit 21 has input terminals connected across the secondary battery C2, and an output terminal connected to the input terminal of the current-to-voltage conversion circuit 31 through the selection switch 22. The resistance circuit 23 has both ends connected across the secondary battery C2, a first output terminal connected to an inverting input terminal of the comparator 27, and a second output terminal connected to a non-inverting input terminal of the comparator 28. The reference voltage circuit 24 has an output terminal connected to a non-inverting input terminal of the comparator 27 and an inverting input terminal of the comparator 28. The comparators 17, 18, 27, and 28 respectively have an output terminals connected to an input terminal of a control circuit which is not shown.

The operational amplifier 32 has a non-inverting input terminal connected to an output terminal of the current-to-voltage conversion circuit 31, and an output terminal connected to a gate of the MOS transistor 33. The MOS transistor 33 has a source connected to one end of the resistor 34 and an inverting input terminal of the operational amplifier 32.

The operational amplifier 35 has a non-inverting input terminal connected to an output terminal of the reference voltage circuit 38, and an output terminal connected to a gate of the MOS transistor 36. The MOS transistor 36 has a source connected to one end of the resistor 37 and an inverting input terminal of the operational amplifier 35.

The current mirror circuit 39 has an input terminal connected to a drain of the MOS transistor 36 and an output terminal connected to a drain of the MOS transistor 33. The switch 15 is connected between the output terminal of the current mirror circuit 39 and the inverting input terminal of the comparator 17. The switch 16 is connected between the output terminal of the current mirror circuit 39 and the non-inverting input terminal of the comparator 18. The switch 25 is connected between the output terminal of the current mirror circuit 39 and the inverting input terminal of the comparator 27. The switch 26 is connected between the output terminal of the current mirror circuit 39 and the non-inverting input terminal of the comparator 28.

The voltage-to-current conversion circuit 11 (21) converts the voltage of the secondary battery C1 (C2) to an input current for the current-to-voltage conversion circuit 31. The current-to-voltage conversion circuit 31 converts the current from the voltage-to-current conversion circuit 11 (21) to an input voltage for the non-inverting input terminal of the operational amplifier 32. The operational amplifier 32 controls the gate of the MOS transistor 33 in such a manner that a voltage generated in the resistor 34 becomes equal to the voltage of the current-to-voltage conversion circuit 31. At that time, the current flowing through the resistor 34 is a current proportional to the voltage of the secondary battery, and the value thereof is denoted by Ic. The operational amplifier 35 controls the gate of the MOS transistor 36 in such a manner that a voltage generated in the resistor 37 becomes equal to the voltage of the reference voltage circuit 38. At that time, the value of a current flowing through the resistor 37 is denoted by Ir.

A failure diagnosis function of the secondary battery monitoring device 100 will next be described.

When failure diagnosis of circuits monitoring the secondary battery C1 is performed, the selection switch 12 is turned on and the selection switch 22 is turned off. The voltage-to-current conversion circuit 11 converts a voltage VC1 of the secondary battery C1 to a current and inputs the same to the current-to-voltage conversion circuit 31 through the selection switch 12. The current-to-voltage conversion circuit 31 converts the input current to the voltage VC1 and obtains a current Ic proportional to the voltage VC1 of the secondary battery C1 by the operational amplifier 32, the resistor 34, and the MOS transistor 33.

Here, the resistance value R34 of the resistor 34 is switched to be equal to the resistance value of the resistance circuit on the upper side of the comparator under diagnosis. That is, when the comparator 17 is diagnosed, the resistance value is set to Ra. When the comparator 18 is diagnosed, the resistance value is set to Ra+Rb.

Further, the voltage of the reference voltage circuit 38 is switched according to each comparator under diagnosis. When the comparator 17 is diagnosed, the reference voltage circuit 38 outputs a voltage Vud less than the reference voltage vref. When the comparator 18 is diagnosed, the reference voltage circuit 38 outputs a voltage Vod higher than the reference voltage vref.

Further, a resistance value R37 of the resistor 37 is switched to an equivalent input resistance value of the resistance circuit as viewed from the input part of the comparator under diagnosis. Thus, when diagnosing the comparator 17, the resistance value R37 is set to 1/{1/Ra+1/(Rb+Rc)}, whereas when diagnosing the comparator 18, the resistance value R37 is set to 1/{1/(Ra+Rb)+1/Rc}.

The switching of these operations is performed by a control signal of an unillustrated test circuit.

Then, a current corresponding to the current Ic flowing through the resistor 34 and the current Ir flowing through the resistor 37 is made to flow into the resistance circuit 13 or flow out from the resistance circuit 13 to thereby diagnose the resistance circuit 13 and the reference voltage circuit 14.

A failure diagnosing operation will next be described.

The selection switch 12 is turned on and the resistance value R34 is set to the resistance value Ra, the resistance value R37 to 1/{1/Ra+1/(Rb+Rc)}, and the voltage of the reference voltage circuit 38 to the voltage Vud, thus making the current Ic to be VC1/Ra, and the current Ir to be Vud·{1/Ra+1/(Rb+Rc)}.

When the switch 15 is turned on, a failure detection circuit Ic−Ir flows in the resistor 13 through the switch 15 from a connection point of the resistors 13a and 13b, and hence the voltage of the inverting input terminal of the comparator 17 is brought to the voltage Vud. At this time, the current Ic equalizes the potential of the connection point of the resistors 13a and 13b to the potential of a negative electrode of the secondary battery C1. The current Ir makes the potential of the connection point of the resistors 13a and 13b higher by the voltage Vud than the potential of the negative electrode of the secondary battery C1. That is, the voltage Vud can be applied to the inverting input terminal of the comparator 17 irrespective of the voltage VC1 of the secondary battery C1.

Here, since the voltage Vud is lower than the reference voltage vref, the comparator 17 detects overdischarge. Thus, the abnormality of the reference voltage vref being lowered can be detected by the absence of overdischarge detection in the comparator 17. Also, the abnormality of the resistance value Ra being lowered can also be detected by the absence of overdischarge detection in the comparator 17. Further, the abnormality of the resistance values Rb and Rc being made high can also be detected by the absence of overdischarge detection in the comparator 17.

Next, the switch 15 is turned off and the resistance value R34 is set to the resistance value Ra+Rb, the resistance value R37 to 1/{1/(Ra+Rb)+1/Rc}, and the voltage of the reference voltage circuit 38 to the voltage Vod, thus making the current Ic to be VC1/Ra+Rb, and the current Ir to be Vod·{1/(Ra+Rb)+1/Rc}.

When the switch 16 is turned on, a failure detection circuit Ir-Ic flows from the current mirror circuit 39 to a connection point of the resistors 13b and 13c through the switch 16 so that the voltage of the non-inverting input terminal of the comparator 18 becomes the voltage Vod. At this time, the current Ic equalizes the potential of the connection point of the resistors 13b and 13c to the potential of the negative electrode of the secondary battery C1. The current Ir makes the potential of the connection point of the resistors 13b and 13c higher by the voltage Vod than the potential of the negative electrode of the secondary battery C1. That is, the voltage Vod can be applied to the non-inverting input terminal of the comparator 18 irrespective of the voltage VC1 of the secondary battery C1.

Here, since the voltage Vod is higher than the reference voltage vref, the comparator 18 detects overcharge. Thus, the abnormality of the reference voltage vref being made high can be detected by the absence of overcharge detection in the comparator 18. Also, the abnormality of the resistance value Rc being lowered can also be detected by the absence of the overcharge detection in the comparator 18. Further, the abnormality of the resistance values Ra and Rb being made high can also be detected by the absence of the overcharge detection in the comparator 18.

Further, failure detection of the abnormality of the resistance value Rb being lowered can be carried out from malfunction of either the comparator 17 or the comparator 18 at the time when the voltage VC1 of the secondary battery C1 is normal.

When failure diagnosis in circuits monitoring the secondary battery C2 is performed, those circuits can be diagnosed in a manner similar to those described above.

A connection failure of a connection point of the secondary battery C1 and the secondary battery C2 can also be detected by allowing only the voltage-to-current conversion circuit 11 to operate at turning off of the switches 15 and 16 by utilizing the voltage-to-current conversion circuit 11 operated when diagnosing.

Figure 2:
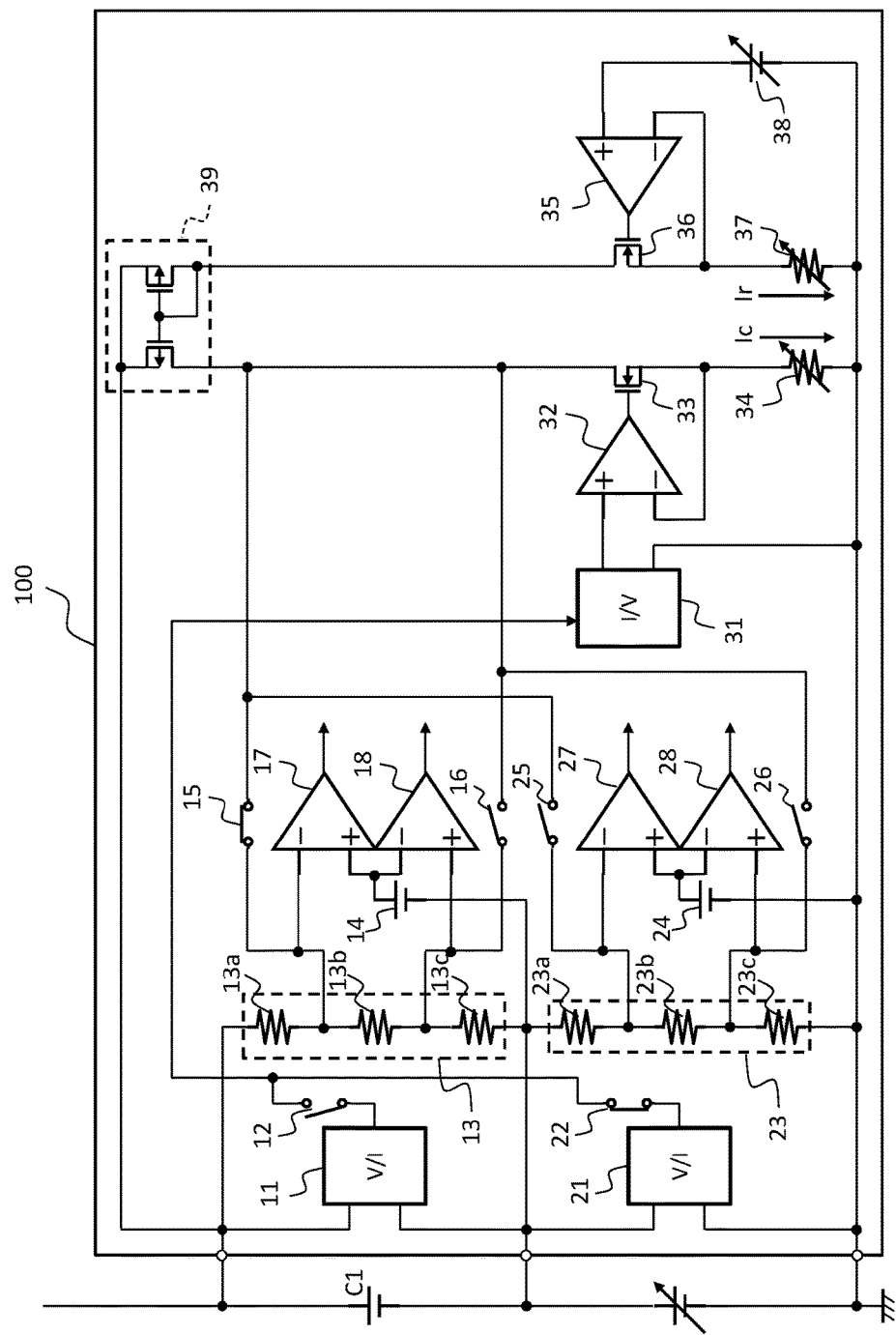
FIG. 2 is a block diagram illustrating a method for diagnosing failure of the secondary battery monitoring device of the present invention.

FIG. 2 is a block diagram illustrating a method for performing failure diagnosis of each circuit for failure diagnosis, which is added in the present embodiment. A description will be made below about a method for performing failure diagnosis for current generation circuits.

Unlike FIG. 1, when the switch 15 or 16 is turned on, the selection switch 12 is turned off and the selection switch 22 is turned on. Further, an external power supply capable of changing the voltage is connected to a terminal to which the secondary battery C2 is to be connected.

In such a state the voltage of the secondary battery C1 is applied to the resistance circuit 13, and a failure detection circuit determined by a current Ic and a current Ir generated by the current generation circuits based on the current of the voltage-to-current conversion circuit 21 flows through the resistance circuit 13. For more details, as the failure detection circuit, a current Ic-Ir flows out from the resistance circuit 13 when the switch 15 is turned on, whereas a current Ir-Ic flows into the resistance circuit 13 when the switch 16 is turned on.

When the voltage of the external power supply is set lower than the voltage of the secondary battery C1 in this state, the voltage of the inverting input terminal of the comparator 17 becomes higher than a voltage Vud since the current Ic becomes smaller than a current generated from the voltage of the secondary battery C1. Here, when this voltage is made higher than a reference voltage Vref, by the absence of overdischarge detection in the comparator 17, it is possible to detect that the current generation circuits generating the currents Ic and Ir, including the voltage-to-current conversion circuit 21 are free from failure. Also, it is possible to detect a failure that the voltage of the inverting input terminal of the comparator 17 for the resistance circuit 13 decreases excessively.

Similarly, the switch 15 is turned off and the switch 16 is turned on to change the voltage of the external power supply, thereby making it possible to detect a failure of an overcharge detection circuit, and a failure that the voltage of the non-inverting input terminal of the comparator 18 for the resistance circuit 13 increases excessively.

Further, the selection switch 12 is turned on and the selection switch 22 is turned off to connect the external power supply capable of changing the voltage to a terminal to which the secondary battery C1 is to be connected, thereby to perform failure diagnosis. Thus, it is possible to detect that the current generation circuit including the voltage-to-current conversion circuit 11 is free of failure.

As described above, since the secondary battery monitoring device 100 according to the present embodiment is equipped with the current generation circuits generating the currents Ic and Ir, and the current mirror circuit 39, and configured to supply a desired current to flow to the resistance circuit by switching the switches 15 and 16 (25, 26), it is possible to detect a failure of the circuit which monitors the secondary battery C1 (C2) irrespective of a failure location and a failure mode.

Although the embodiment of the present invention has been described above, the present invention is not limited to the above embodiment, but may be changed in various ways without the scope not departing from the gist of the present invention.

The circuits for monitoring the secondary battery have been described by taking the example equipped with a circuit for overdischarge detection and a circuit for overcharge detection. They can be however configured to have either one of them. Also, only the circuits monitoring the two secondary batteries connected in series have been illustrated by way of example. Even one or three or more are similarly available as the number of the secondary batteries. Further, it has been described that each current generation circuit is formed from the operational amplifier, the MOS transistor, and the resistor. Any current generation circuit can be used if the function is satisfied, and not limited to the circuit shown in the embodiments. Further, although the resistance values of the resistors in the resistance circuit 13 and the resistance circuit 23 are set to the same value, the resistance values of the respective resistors may be different in a case where the secondary batteries C1 and C2 are different in voltage. In such a case, there is a need to separately provide current generation circuits.

What is claimed is:

1. A secondary battery monitoring device which detects an abnormality of a secondary battery, comprising:
   a resistance circuit to which both ends of the secondary battery are to be connected and which outputs a detection voltage from an output terminal thereof;
   a detection circuit which detects the abnormality of the secondary battery, based on the detection voltage;
   a voltage-to-current conversion circuit to which both ends of the secondary battery are to be connected and which converts a voltage of the secondary battery to a current;
   a current-to-voltage conversion circuit which converts the current of the voltage-to-current conversion circuit to a voltage;
   a first current generation circuit which generates a first current proportional to the voltage of the secondary battery, based on the voltage of the current-to-voltage conversion circuit;
   a second current generation circuit which generates a second current proportional to a voltage for setting the output terminal of the resistance circuit to a failure diagnosis voltage;
   a current mirror circuit which generates a failure detection circuit corresponding to the first current and the second current; and
   a switch which permits the failure detection circuit to flow to the output terminal of the resistance circuit.

2. A secondary battery monitoring device which detects an abnormality of a secondary battery, comprising:
   a resistance circuit to which both ends of the secondary battery are connected and which outputs an overdischarge detection voltage from a first output terminal and outputs an overcharge detection voltage from a second output terminal;
   an overdischarge detection circuit which detects overdischarge of the secondary battery, based on the overdischarge detection voltage;
   an overcharge detection circuit which detects overcharge of the secondary battery, based on the overcharge detection voltage;
   a voltage-to-current conversion circuit to which both ends of the secondary battery are connected and which converts a voltage of the secondary battery to a current;
   a current-to-voltage conversion circuit which converts the current of the voltage-to-current conversion circuit to a voltage;
   a first current generation circuit which generates a first current proportional to the voltage of the secondary battery, based on the voltage of the current-to-voltage conversion circuit;
   a second current generation circuit which generates a second current proportional to a voltage for setting the first and second output terminals of the resistance circuit to a failure diagnosis voltage;
   a current mirror circuit which generates a failure detection circuit corresponding to the first current and the second current;
   a first switch which permits the failure detection circuit to flow to the first output terminal of the resistance circuit; and
   a second switch which permits the failure detection circuit to flow from the second output terminal of the resistance circuit.

3. The secondary battery monitoring device according to claim 2, wherein when the first switch is turned on and the second switch is turned off, a failure of the overdischarge detection circuit is diagnosed, and
   wherein when the first switch is turned off and the second switch is turned on, a failure of the overcharge detection circuit is diagnosed.

4. The secondary battery monitoring device according to claim 3, wherein when the failure of the overdischarge detection circuit is diagnosed and when the failure of the overcharge detection circuit is diagnosed,
   the first current generation circuit outputs the first current by switching, and
   the second current generation circuit outputs the second current by switching.

5. The secondary battery monitoring device according to claim 2, wherein when the failure of the overdischarge detection circuit is diagnosed and when the failure of the overcharge detection circuit is diagnosed,
   the first current generation circuit outputs the first current by switching, and
   the second current generation circuit outputs the second current by switching.

6. A method for diagnosing failure of a secondary battery monitoring device detecting an abnormality of each of secondary batteries, including:

a first resistance circuit to which both ends of a first secondary battery are to be connected and which outputs a first detection voltage from an output terminal;

a first detection circuit which detects an abnormality of the first secondary battery, based on the first detection voltage;

a first voltage-to-current conversion circuit to which both ends of the first secondary battery are to be connected and which converts a voltage of the first secondary battery to a current;

a second resistance circuit to which both ends of a second secondary battery connected in series with the first secondary battery are connected and which outputs a second detection voltage from an output terminal;

a second detection circuit which detects an abnormality of the second secondary battery, based on the second detection voltage;

a second voltage-to-current conversion circuit to which both ends of the second secondary battery are connected and which converts a voltage of the second secondary battery to a current;

a current-to-voltage conversion circuit which has an input terminal connected to the first voltage-to-current conversion circuit through a first switch and connected to the second voltage-to-current conversion circuit through a second switch and which converts the current of the first or second voltage-to-current conversion circuit to a voltage;

a first current generation circuit which generates a first current proportional to the voltage of the first secondary battery, based on the voltage of the current-to-voltage conversion circuit;

a second current generation circuit which generates a second current proportional to a voltage for setting the output terminal of the first or second resistance circuit to a failure diagnosis voltage;

a current mirror circuit which generates a failure detection circuit corresponding to the first current and the second current;

a third switch which permits the failure detection circuit to flow to the output terminal of the first resistance circuit; and a fourth switch which permits the failure detection circuit to flow to the output terminal of the second resistance circuit, said method comprising the steps of:

applying a voltage from an external power supply to a terminal to which both ends of the second secondary battery are connected;

turning off the first switch, turning on the second switch, turning on the third switch, and turning off the fourth switch; and thereby diagnosing a failure of the secondary battery monitoring device according to a result of detection by the first detection circuit.

* * * * *